(12) United States Patent
Hanzlik et al.

(10) Patent No.: US 6,176,299 B1
(45) Date of Patent: Jan. 23, 2001

(54) COOLING APPARATUS FOR ELECTRONIC DEVICES

(75) Inventors: Steven E. Hanzlik; Michael A. Hansen, both of Fort Collins; Guy R. Wagner, Loveland, all of CO (US)

(73) Assignee: Agilent Technologies, Inc., Palo Alto, CA (US)

(*) Notice: Under 35 U.S.C. 154(b), the term of this patent shall be extended for 0 days.

(21) Appl. No.: 09/253,877

(22) Filed: Feb. 22, 1999

(51) Int. Cl.[7] .................................................. H05K 7/20
(52) U.S. Cl. ........................ 165/80.3; 165/121; 361/697
(58) Field of Search ............................ 165/80.3, 121; 361/697, 704

(56) References Cited

U.S. PATENT DOCUMENTS

| | | | |
|---|---|---|---|
| 2,936,409 | 5/1960 | Jackson et al. | 317/234 |
| 3,220,471 | 11/1965 | Coe | 165/121 |
| 3,262,028 | 7/1966 | Hermann | 317/234 |
| 3,366,171 | 1/1968 | Scharli | 165/80 |
| 3,566,958 | 3/1971 | Zelina | 165/80 |
| 3,592,260 | 7/1971 | Berger | 165/121 |
| 3,686,533 | 8/1972 | Garnier et al. | 317/100 |
| 3,727,114 | 4/1973 | Oshima | 317/234 R |
| 4,194,556 | 3/1980 | Watanabe et al. | 165/51 |
| 4,233,644 | 11/1980 | Hwang et al. | 361/384 |
| 4,489,363 | 12/1984 | Goldberg | 361/383 |
| 4,541,004 | 9/1985 | Moore | 357/81 |
| 4,546,405 | 10/1985 | Hultmark et al. | 361/386 |
| 4,611,238 | 9/1986 | Lewis et al. | 357/81 |
| 4,620,216 | 10/1986 | Horvath | 357/81 |

(List continued on next page.)

FOREIGN PATENT DOCUMENTS

| | | |
|---|---|---|
| 27 43708A | 4/1979 | (DE) . |
| 4231122A1 | 7/1993 | (DE) . |
| 9404388U1 | 6/1994 | (DE) . |
| 1200000 | 2/1960 | (FR) ......... 165/80.3 |
| 2287837 | 9/1995 | (GB) . |
| 2303970 | 3/1997 | (GB) . |
| 63-113460 | 7/1988 | (JP) . |
| 402034993 | 2/1990 | (JP) ......... 361/694 |
| 2-286900 | 11/1990 | (JP) . |
| 3-229492 | 11/1991 | (JP) . |
| 406132434 | 5/1994 | (JP) ......... 361/697 |
| WO 88/00394 | 1/1988 | (WO) . |
| WO 93/08600 | 4/1993 | (WO) . |

OTHER PUBLICATIONS

Literature re TCM :"Thermalloy Cooling Modules" by Thermalloy, Inc.

"Velox Backgrounder" by Velox Computer Technology, Inc., Melvin G. Snyder, President & CEO. pp. 1–6.

"The Experimental Step 486/50 Redefines Cool", Rob Mitchell, BYTE, Dec. 1990.

"Icejet" 50 MHz 486 Computer System Board, by Velox Computer Technology, Inc.

Literature re: Velox "IceCap" by Velox Computer Technology, Inc.

* cited by examiner

Primary Examiner—Allen Flanigan

(57) ABSTRACT

Disclosed herein is a cooling device primarily for cooling integrated circuits or other electronic devices during operation. The cooling device may include a heat sink portion and a fan, or other air movement device. The outer periphery of the heat sink portion may be formed with outwardly extending lobes, leaving recessed areas between the lobes. The lobes may be sized and located so as to correspond to heat concentration areas on an electronic device package. In this manner, heat sink material may be concentrated adjacent heat concentration areas where more heat removal is required. The overall mass and size of the heat sink portion may, thus, be reduced without significantly impairing the ability of the cooling device to remove heat from an electronic device.

34 Claims, 12 Drawing Sheets

U.S. PATENT DOCUMENTS

| | | | |
|---|---|---|---|
| 4,639,829 | 1/1987 | Ostergren et al. | 361/386 |
| 4,662,830 | 5/1987 | Pottebaum | 417/424 |
| 4,682,651 | 7/1987 | Gabuzda | 165/80.3 |
| 4,715,430 | 12/1987 | Arnold et al. | 165/80.3 |
| 4,733,293 | 3/1988 | Gabuzda | 357/81 |
| 4,812,733 | 3/1989 | Tobey | 323/285 |
| 4,884,631 | 12/1989 | Rippel | 165/185 |
| 4,970,579 | 11/1990 | Aridt et al. | 357/81 |
| 5,000,254 | 3/1991 | Williams | 165/85 |
| 5,019,880 | 5/1991 | Higgins, III | 357/81 |
| 5,029,236 | 7/1991 | Yasuda et al. | 455/90 |
| 5,191,230 | 3/1993 | Heung | 307/141 |
| 5,272,599 | 12/1993 | Koenen | 361/710 |
| 5,287,249 | 2/1994 | Chen | 361/718 |
| 5,288,203 | 2/1994 | Thomas | 415/178 |
| 5,297,617 | 3/1994 | Herbert | 165/80.3 |
| 5,299,632 | 4/1994 | Lee | 165/80.3 |
| 5,309,983 | 5/1994 | Bailey | 165/80.3 |
| 5,335,722 | 8/1994 | Wu | 165/122 |
| 5,353,863 | 10/1994 | Yu | 165/80.3 |
| 5,377,745 | 1/1995 | Hsieh | 165/80.3 |
| 5,409,352 | 4/1995 | Lin | 415/177 |
| 5,437,327 | 8/1995 | Chiou | 165/122 |
| 5,445,215 | 8/1995 | Herbert | 165/80.3 |
| 5,484,262 | 1/1996 | Thomas et al. | 415/178 |
| 5,502,618 | 3/1996 | Chiou | 361/695 |
| 5,504,650 | 4/1996 | Katsui et al. | 361/697 |
| 5,519,575 | 5/1996 | Chiou | 361/697 |
| 5,582,240 | 12/1996 | Widmayer | 165/80.3 |
| 5,583,746 | 12/1996 | Wang | 361/697 |
| 5,609,202 | 3/1997 | Anderson et al. | 165/80.3 |
| 5,629,560 | 5/1997 | Katsui et al. | 257/712 |
| 5,629,834 | 5/1997 | Kodama et al. | 361/695 |
| 5,740,013 | 4/1998 | Roesner et al. | 361/697 |
| 5,785,116 | 7/1998 | Wagner | 165/80.3 |
| 5,794,685 | 8/1998 | Dean | 165/121 |
| 5,867,365 * | 2/1999 | Chiou | 361/690 |
| 5,910,694 * | 6/1999 | Yokozawa et al. | 310/89 |
| 5,927,385 * | 7/1999 | Yeh | 165/80.3 |
| 5,943,209 * | 8/1999 | Liu | 361/695 |

COOLING APPARATUS FOR ELECTRONIC DEVICES

FIELD OF THE INVENTION

The present invention relates generally to cooling devices and, more particularly, to a cooling device for removing heat from an electronic device.

BACKGROUND OF THE INVENTION

Electronic devices, such as integrated circuit devices, are increasingly being used in modern applications. One prevalent example is the computer. The central processing unit or units of most computers, including personal computers, is constructed from an integrated circuit device.

During normal operation, electronic devices generate significant amounts of heat. If this heat is not continuously removed, the electronic device may overheat, resulting in damage to the device and/,or a reduction in operating performance. In order to avoid such overheating, cooling devices are often used in conjunction with electronic devices.

One such cooling device is a fan assisted heat sink cooling device. In such a device, a heat sink is formed of a material, such as aluminum, which readily conducts heat. The heat sink is usually placed on top of and in contact with the electronic device. Due to this contact, heat generated by the electronic device is conducted into the heat sink and away from the electronic device.

The heat sink may include a plurality of cooling fins in order to increase the surface area of the heat sink and, thus, maximize the transfer of heat from the heat sink into the surrounding air. In this manner, the heat sink draws heat away from the electronic device and transfers the heat into the surrounding air. An example of a heat sink is disclosed in U.S. Pat. No. 5,794,685 of Dean for HEAT SINK DEVICE HAVING RADIAL HEAT AND AIRFLOW PATHS, which is hereby incorporated by reference for all that is disclosed therein.

In order to enhance the cooling capacity of a heat sink device, an electrically powered fan is often mounted within or on top of the heat sink. In operation, the fan causes air to move over and around the fins of the heat sink device, thus cooling the fins by enhancing the transfer of heat from the fins into the ambient air. An example of a heat sink device including a fan is disclosed in U.S. Pat. No. 5,785,116 of Wagner for FAN ASSISTED HEAT SINK DEVICE, which is hereby incorporated by reference for all that is disclosed therein.

Over the years, as the power of electronic devices has increased, so has the amount of heat generated by these devices. In order to adequately cool these higher powered electronic devices, cooling devices with greater cooling capacities are required. There is also an increasing trend to package electronic devices in multi-electronic device packages. This multi-electronic device arrangement presents an additional challenge with respect to cooling since it results in several heat sources being located within one package. Since each of the electronic devices in the package represents a heat emission source, each must be cooled. In order to adequately cool these multiple electronic device packages, a cooling device must be large enough to contact, or be in close proximity to, all of the electronic devices within the package. Accordingly, cooling devices for cooling such multiple electronic device packages typically are relatively large. Such large cooling devices are problematic in that they are relatively expensive, heavy, and often inefficient.

Another problem with fan assisted heat sink cooling devices is the noise generated by the fans, particularly in situations where larger and/or multiple fans are used to achieve increased cooling capacity. This is particularly a problem in desktop computers where a user is commonly in close proximity to the machine. The problem is further aggravated in situations where multiple electronic devices, and, thus, multiple cooling devices, are mounted in the same computer case, as occurs in many high power computers.

Thus, it would be generally desirable to provide an apparatus and method which overcome these problems associated with cooling devices.

SUMMARY OF THE INVENTION

Disclosed herein is a cooling device primarily for cooling integrated circuits or other electronic devices during operation.

The cooling device may include a heat sink portion having a chamber therein. A fan, or other air movement device may be housed within the chamber. A plurality of slots, defining vanes therebetween, may extend between the chamber and the exterior of the heat sink. The outer periphery of the heat sink portion may be formed with outwardly extending protrusions, leaving recessed areas between the protrusions. The protrusions may be sized and located so as to correspond to heat concentration areas on an electronic device package. The recessed areas, on the other hand may be located so as to correspond to areas on the electronic device package which are not heat concentration areas. In this manner, heat sink material may be concentrated adjacent to heat concentration areas where more heat removal is required. The overall mass and size of the heat sink portion may, thus, be reduced without significantly impairing the ability of the cooling device to remove heat from an electronic device.

The heat sink protrusions may, for example, be of generally circular shape. Alternatively, the protrusions may be formed having any other shape, such as a rectangular or a triangular shape. Although the protrusions may be formed having any shape, they may alternatively be referred to herein simply as "lobes".

The heat sink chamber may include a lower wall portion which is located beneath the fan blades when a fan is installed within the chamber. This lower wall portion may slope away from the fan blades in a radially outward direction. In this manner the distance between the fan blades and the chamber lower wall portion is increased in areas where the fan blades rotate at the highest velocity. It has been found that this increased distance results in reduced noise emission from the cooling device when the fan is in operation.

The heat sink fan chamber may include a wider portion at its upper end, thus causing at least a portion of the outer wall of the fan chamber to have an increased spacing from the fan blades. This increased spacing has also been found to reduce noise emission from the cooling device when the fan is in operation. The slots in the heat sink portion may either be radially oriented or may be offset slightly from the radial direction in order to further reduce noise emission.

The cooling device may be attached to an electronic component by providing either integrally formed attachment feet or by using a bracket arrangement. In the case where a bracket arrangement is used, the bracket may be either integrally formed with the heat sink portion or may be a separate assembly.

DETAILED DESCRIPTION OF THE INVENTION

Figure 1:
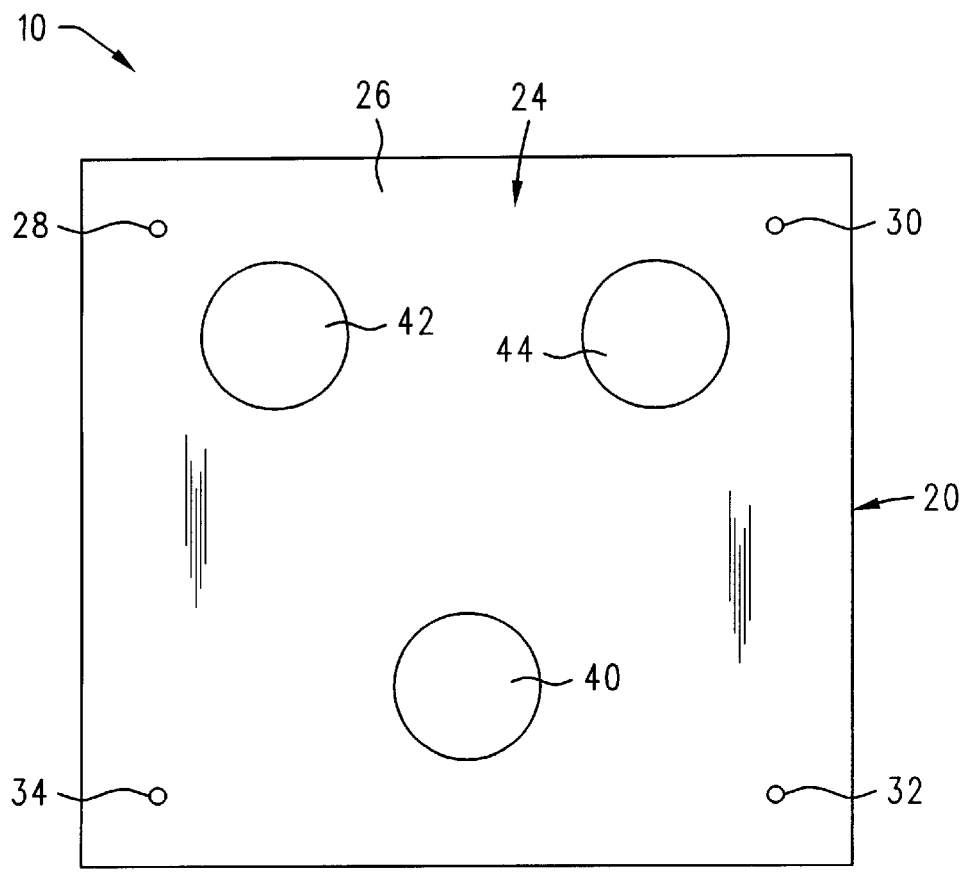
FIG. 1 is a top plan view of an electronic device package.

FIGS. 3–17, in general, illustrate a cooling device 50 for dissipating heat. Cooling device 50 may include a substantially planar surface 110; a chamber 120 having a first open end 118 and a second substantially closed end 124; a heat conductive portion 104 extending between the chamber second closed end 124 and the planar surface 110 and a chamber wall member 114 substantially surrounding the chamber 120. The chamber wall member may include a first lobe 150 comprising an enlarged portion of the chamber wall member 114; a second lobe 170 including an enlarged portion of the chamber wall member 114 and a recessed area 152 located between the first lobe 150 and the second lobe 170. The recessed area 152 may include a smaller portion of the chamber wall member 114 relative to the first lobe 150 and the second lobe 170. The first lobe 150 may be larger than the second lobe 170.

FIGS. 3–17 further illustrate, in general, a cooling device 50 for cooling a component 10 having a first heat generating area 40 and a second heat generating area 42 which is spaced a first distance from the first heat generating area 40. The cooling device 50 may include a plurality of vanes 220 having slots 200 extending therebetween. The plurality of vanes 220 may define an external periphery 102 of the cooling device 50. The external periphery 102 may include a first outwardly extending lobe 150 and a second outwardly extending lobe 170. The second outwardly extending lobe 170 may be spaced the first distance from the first outwardly extending lobe 150.

FIGS. 3–17 further illustrate, in general a cooling assembly including a heat source 10 and a cooling device 50. The heat source 10 may include a first heat emitting area 40 and a second heat emitting area 42 distinctly located with respect to the first heat emitting area 40. The cooling device 50 may include a plurality of vanes 220 having slots 200 extending therebetween. The plurality of vanes 220 may define an external periphery 102 of the cooling device 50. The external periphery 102 may include a first outwardly extending lobe 150 and a second outwardly extending lobe 170. The first outwardly extending lobe 150 may be located adjacent the first heat emitting area 40.

Having thus described the apparatus in general, it will now be described in further detail.

For purposes of the description set forth herein, unless otherwise specified, certain directional terms shall, when used herein, have the meanings set forth below. The terms "radial" and "radially" are with reference to the axis B—B, e.g., FIG. 4, and generally refer to directions normal to this axis. The terms "up", "upper", "upwardly" and the like refer the direction indicated by the arrow 14, FIG. 6. The terms "down", "lower", "downwardly" and the like refer to the direction indicated by the arrow 16, FIG. 6.

The above terms are defined for illustration purposes only. In actual use, the cooling device described herein may be mounted in any position, thus making terms such as "up" and "down" relative to the orientation of the cooling device.

Figure 2:
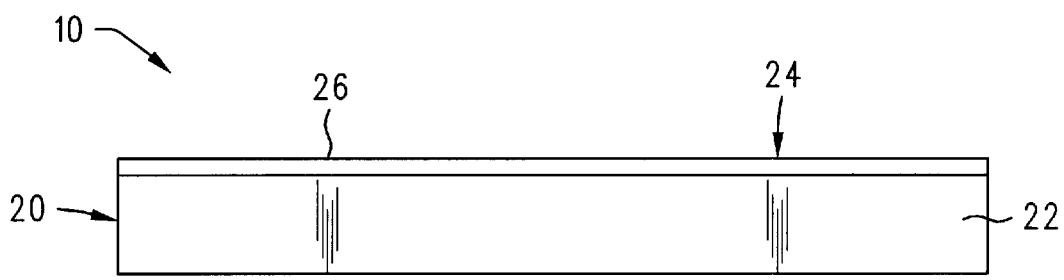
FIG. 2 is a front elevation view of the electronic device package of FIG. 1.

FIGS. 1 and 2 illustrate an electronic device package 10. Electronic device package 10 may include a housing 20 which, in turn, may include a body portion 22, FIG. 1, and a cover portion 24. Cover portion 24 may have an upper surface 26 and an oppositely disposed lower surface, not shown. Threaded openings 28, 30, 32, 34 may also be formed in the cover portion 24.

Electronic device housing 20 may enclose a plurality of electronic devices, not shown, in a conventional manner. Housing 20 may, for example, be formed of a plastic material. Housing cover portion 24 may be made of a heat conductive material, such as aluminum, and may be in contact with at least some of the plurality of the electronic devices housed within the housing 20. In this manner, heat generated by the electronic devices may be transferred into the cover portion 24. This transfer of heat causes areas of heat concentration to be formed within the cover portion 24. Specifically, areas of heat concentration 40, 42 and 44 may be formed, as illustrated in FIG. 1.

Heat concentration area 40, for example, may be caused by a first electronic device, e.g., a central processor chip, located directly beneath the area 40 and in contact with the cover portion 24. In this manner, heat from the first electronic device is conducted into the cover portion causing a concentration of heat in the area 40 of the cover portion 24.

Heat concentration area 42, for example, may be caused by a second electronic device, e.g., a cache RAM chip, located directly beneath the area 42 and in contact with the cover portion 24. In this manner, heat from the second electronic device is conducted into the cover portion causing a concentration of heat in the area 42 of the cover portion 24.

Heat concentration area 44, for example, may be caused by a third electronic device which may, for example, be another cache RAM chip, located directly beneath the area 44 and in contact with the cover portion 24. In this manner, heat from the third electronic device is conducted into the cover portion causing a concentration of heat in the area 44 of the cover portion 24.

In the example listed above, heat concentration area 40 is caused by a central processing chip, whereas the heat concentration areas 42 and 44 are each caused by cache RAM chips. Since a central processor chip will generally generate more heat than will a cache RAM chip, the heat concentration area 40 may be significantly hotter than either of the heat concentration areas 42, 44.

Electronic device package 10 may, for example, be of the type commercially available from INTEL Corporation and sold as a "PENTIUM II XEON" Processor.

As discussed previously, it is desirable to use cooling devices to remove heat from electronic devices, such as those contained in the electronic package 10, during operation in order to prevent damage to the electronic devices and to enhance their operation. As also discussed previously, in order to effectively remove heat from a multiple electronic device package, such as the electronic device package 10, it has generally been necessary to provide a large cooling device which is capable of contacting, or being in close proximity to, all of the electronic devices within the package. Such large cooling devices, however, are problematic in that they are expensive and often inefficient.

Figure 3:
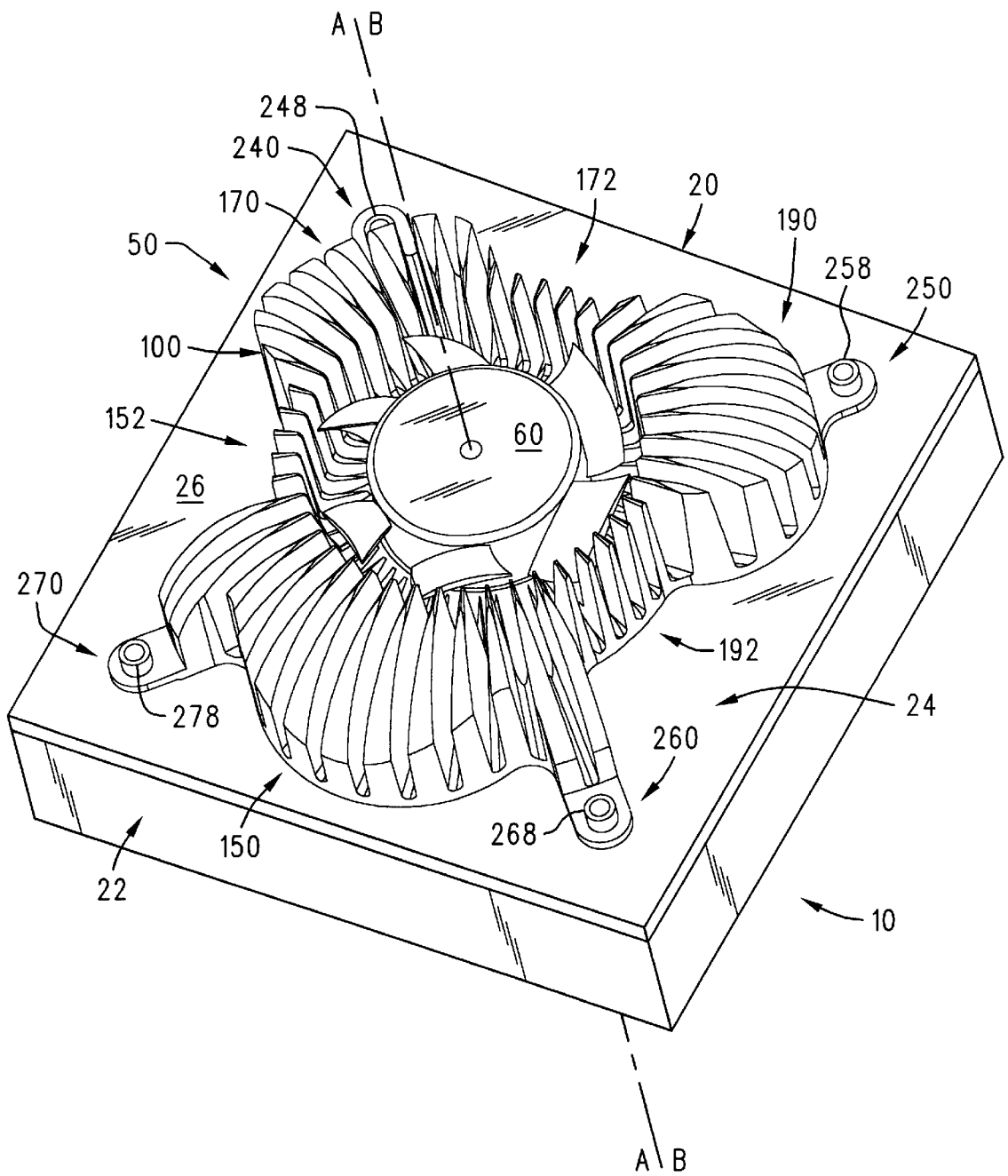
FIG. 3 is top perspective view of a cooling device mounted on the electronic device package of FIG. 1.

Referring now to FIG. 3, an improved cooling device 50, which overcomes the above problems, is shown mounted to the upper surface 26 of the electronic device package cover portion 24. Generally, cooling device 50 may include a fan 60 mounted within a heat sink 100. Heat sink 100 may include a plurality of outwardly extending lobes 150, 170, 190. A recessed area 152 may be located between the lobes 150 and 170; a recessed area 172 may be located between the lobes 170 and 190 and a recessed area 192 may be located between the lobes 190 and 150. As can be appreciated, when the cooling device 50 is mounted to the upper surface 26 of the electronic device package cover portion 24, as illustrated in FIG. 3, the lobe 150 will be in direct contact with the heat concentration area 40, FIG. 1; the lobe 170 will be in direct contact with the heat concentration area 42 and the lobe 190 will be in direct contact with the heat concentration area 44. In this manner, the cooling device 50 provides additional heat sink material, via the lobes 150, 170, 190, in the specific locations where heat removal from the electronic device package 10 is required, i.e., the heat concentration areas 40, 42, 44, respectively. Conversely, heat sink material is omitted in areas where heat removal from the electronic device package 10 is not required, i.e., in the area of the recesses 152, 172, 192 where no heat concentration areas are located.

The cooling device 50 will now be described in further detail. Referring again to FIG. 3, the fan 60 may be rotatable about a fan rotation axis A—A. The fan 60 may be driven by a 12 volt DC brushless motor. Fan 60 may, for example, be of the type commercially available from Matsushita Electric Company of Japan, sold as Model FBA06T12H and under the tradename "PANAFLO" (with its housing removed). Fan 60 may have a height (measured along the axis A—A) of about 14 mm and a diameter (at the tips of the fan blades) of about 56 mm.

FIGS. 4–9 illustrate the cooling device heat sink 100 in further detail. Heat sink 100 may include a substantially planar bottom surface 110, FIGS. 5–8, which is adapted to contact the upper surface 26 of the electronic package cover portion 24 when the heat sink 100 is mounted to the electronic package 10 as shown in FIG. 3. Referring to FIGS. 4–8, the heat sink 100 may include a central axis B—B which extends in a perpendicular manner relative to the bottom surface 110. When the fan 60 is installed within the heat sink 100, as illustrated, for example, in FIG. 3, the fan rotation axis A—A will be superimposed on the heat sink central axis B—B.

Figure 4:
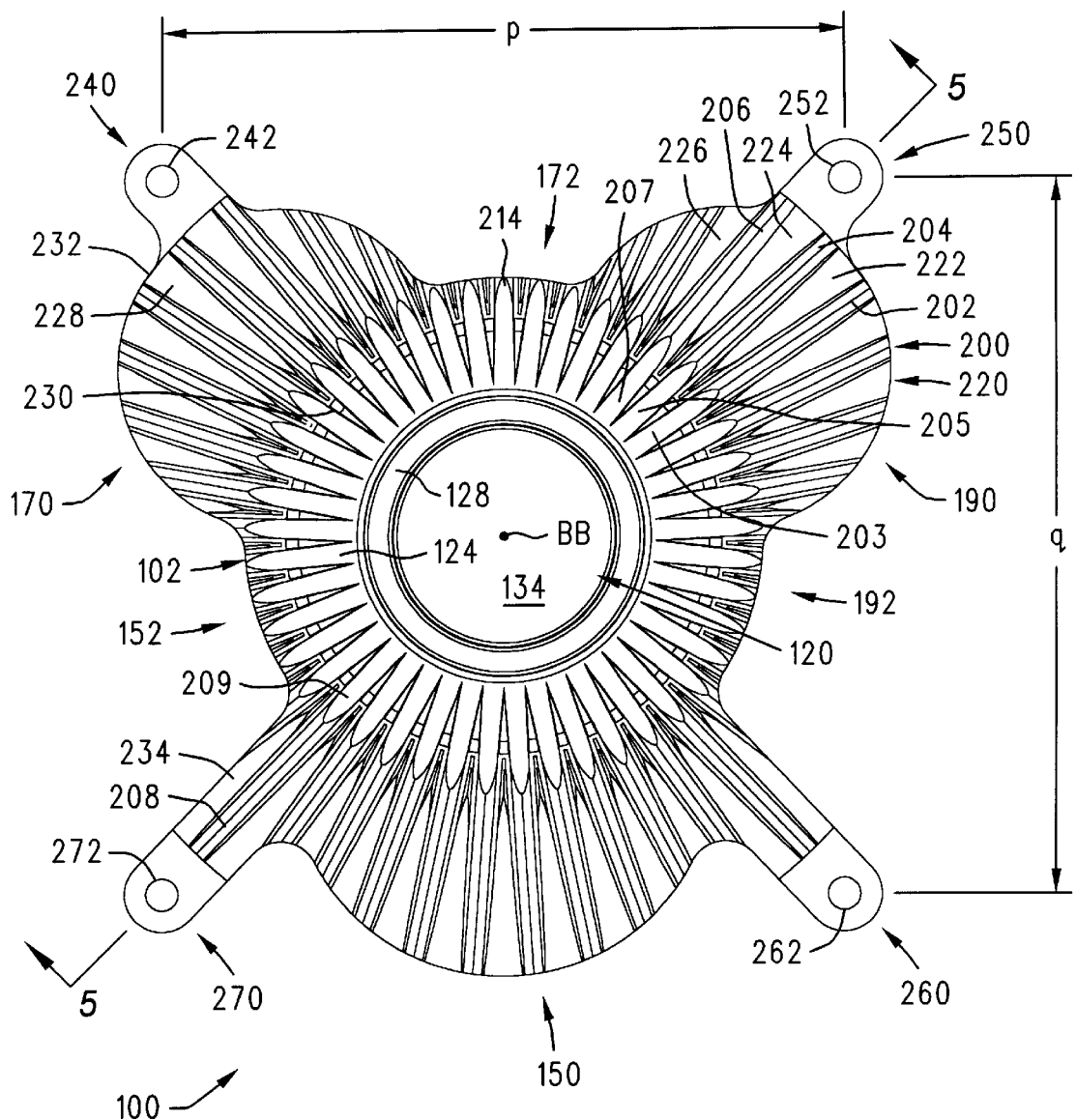
FIG. 4 is a top plan view of a heat sink of the cooling device of FIG. 3.
Figure 5:
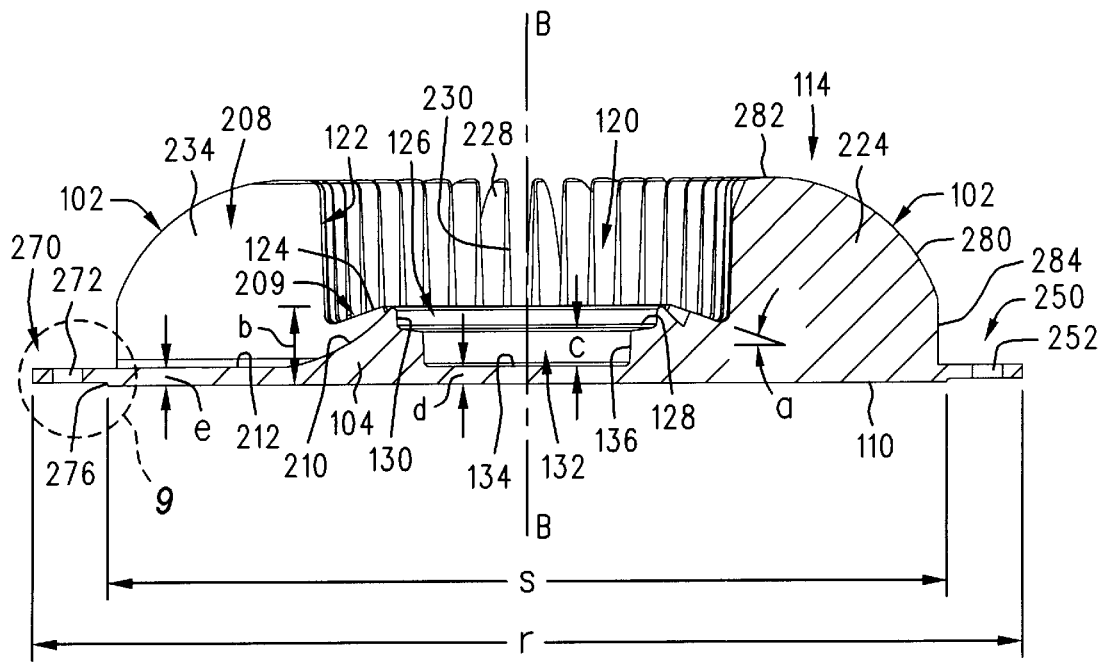
FIG. 5 is a cross-sectional elevation view taken along the line 5—5 in FIG. 4.

Referring to FIGS. 4 and 5, a fan chamber 120 may be provided as shown. Fan chamber 120 may be generally cylindrical in shape and may be adapted to receive the fan 60 in a manner as shown in FIG. 3. A plurality of slots 200, such as the individual slots 202, 204, 206, 208, 214, may extend radially outwardly from the fan chamber 120 to the outer periphery 102 of the heat sink 100. A plurality of cooling vanes 220, such as the individual cooling vanes 222, 224, 226, 228, 234 may also extend radially outwardly from the fan chamber 120 to the outer periphery 102. As can be appreciated, one of the cooling vanes 220 will extend between every two of the slots 200 as illustrated, for example, with reference to the cooling vane 222 extending between the slots 202 and 204 and the cooling vane 224 extending between the slots 204 and 206.

As can be appreciated, each of the cooling vanes 220 will have a radially inner face and a radially outer face. With reference to FIGS. 4 and 5, the vane 228, for example, will have a radially inner face 230 and a radially outer face 232. As can further be appreciated, the radially outer faces of all of the vanes 220, e.g., the radially outer face 232 of the vane 228, together, form the outer periphery 102 of the heat sink 100. In a similar manner, the radially inner faces of all of the vanes 220, e.g., the radially inner face 230 of the vane 228, together, form a generally annular "surface" 122, FIG. 5, which defines the radially outer periphery of the fan chamber 120. Outer surface 122 may be formed at a radius of about 29 mm from the heat sink central axis B—B. With reference to FIG. 4, the width of the slots (as measured in a direction normal to the radial direction) may be substantially constant along their length. As a result, each of the vanes 200 may be thicker at the heat sink outer periphery 102 than at the fan chamber outer surface 122. As can be appreciated, at the outer periphery 102 of the heat sink 100, the vanes 200 in the lobes 150, 170, 190 will be thicker than the vanes in the recesses 152, 172, 192 due to the fact that the vanes 200 in the lobes have longer radial lengths than do those in the recesses.

Figure 6:
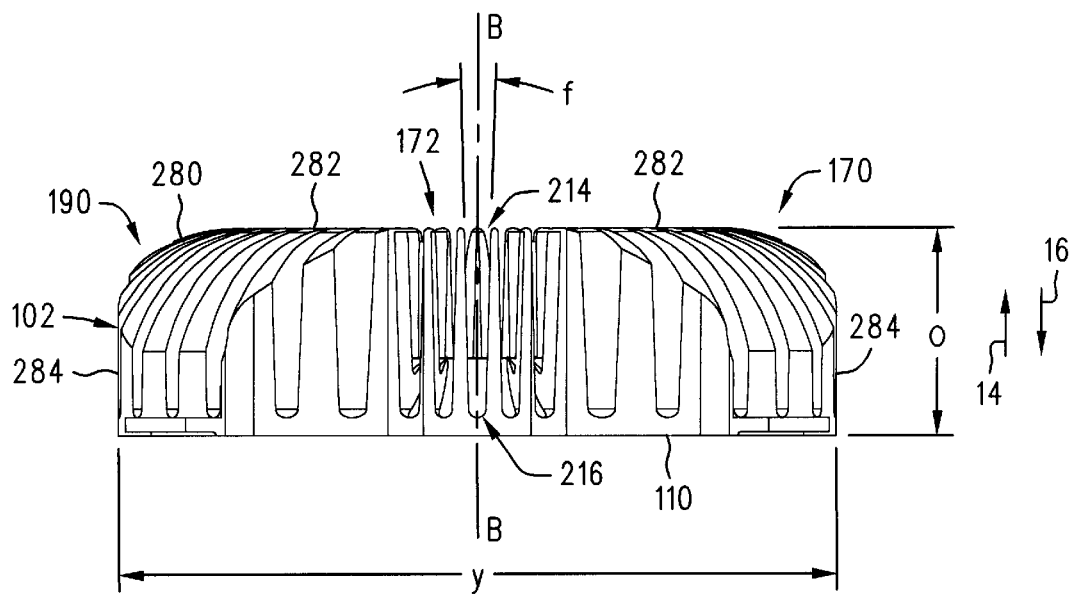
FIG. 6 is a side elevation view as viewed from the top of FIG. 4.
Figure 7:
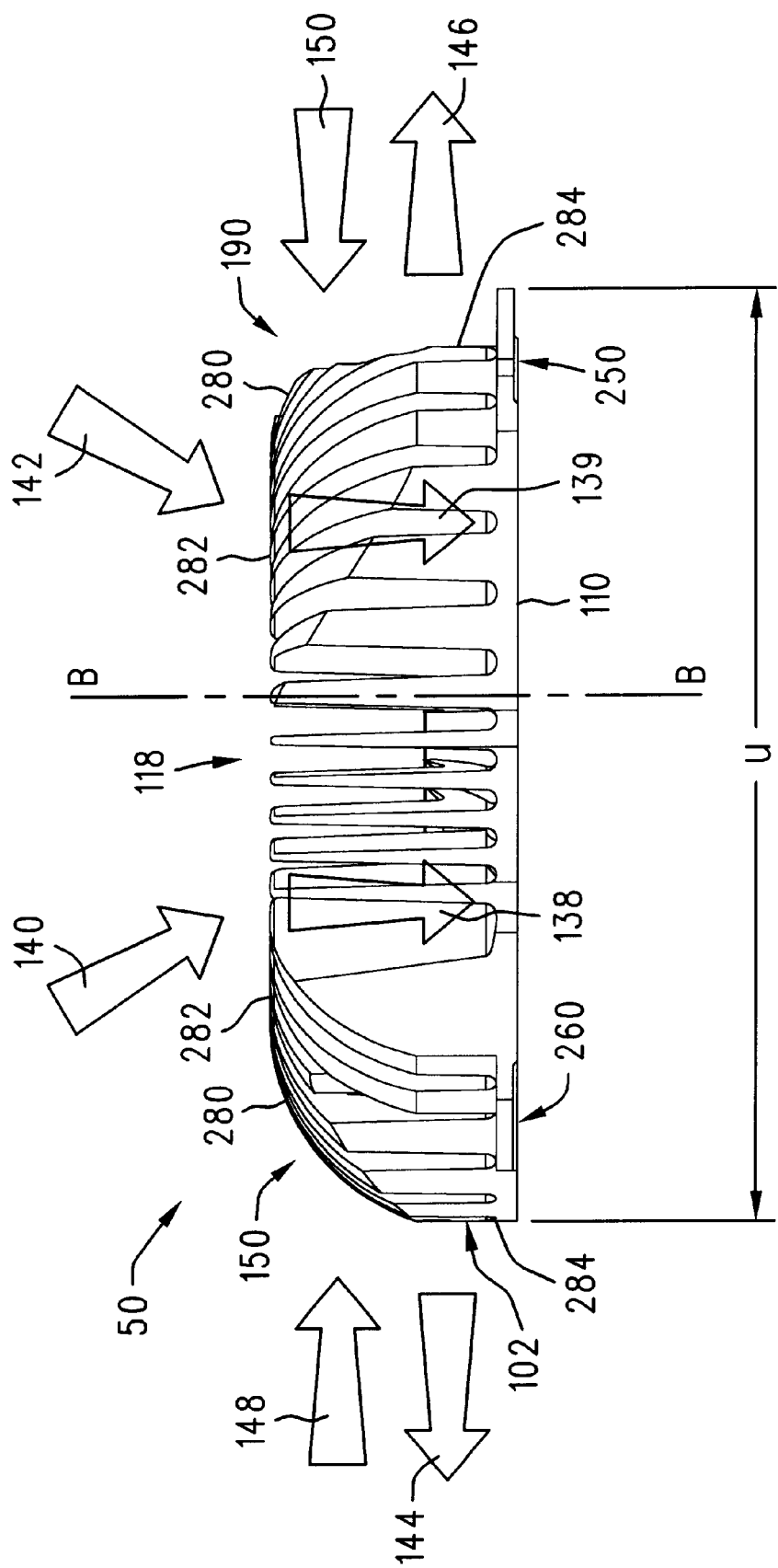
FIG. 7 is side elevation view as viewed from the right side of FIG. 4.

With reference to FIGS. 4 and 5, the vanes 220 generally define a wall portion 114 extending between the fan chamber outer surface 122 and the outer periphery 102 of the heat sink 100. Referring for example to FIGS. 5–7, the vanes 220 may include a rounded profile 280 in the area of the lobes 150, 170, 190. The vanes 220 may also have an upper relatively flat surface 282 which may be substantially parallel to the heat sink bottom surface 110 and a relatively vertical surface 284 which may be substantially perpendicular to the bottom surface 110. With reference to FIG. 6, heat sink 100 may, for example, have a height "o" of about 34.5 mm extending between the heat sink bottom surface 110 and the upper surface 282 of the vanes 220 and a width "y" of about 102.7 mm extending between the lobes 170 and 190 at the outer periphery 102.

Referring again to FIGS. 4 and 5, fan chamber 120 may also include a bottom surface 124. A heat conductive base portion 104 may extend between the fan chamber bottom surface 124 and the heat sink bottom surface 110. As best shown in FIG. 5, fan chamber bottom surface 124 may be formed at an angle "a" relative to the heat sink bottom surface 110 and, thus, may taper toward the bottom surface 110 in a radially outward direction. This tapering away of the fan chamber bottom surface 124 has been found to reduce noise generated by the cooling device 50 when in operation. Specifically, the tapered configuration of the surface 124 causes the spacing between the surface 124 and the lower edge of the blades of the fan 60 to increase in a radially outward direction. As can be appreciated, radially outward portions of the fan blades will rotate at a higher velocity relative to radially inward portions of the fan blades. The tapered configuration of the surface 124, thus, causes the surface 124 to be spaced further from the lower edge of the fan blades in locations where the fan blades are moving at a higher velocity. This, in turn, has been found to reduce the noise generated by the fan 60 when in operation. To achieve adequate noise reduction, the angle "a" should be between about 15 and about 25 degrees. Most preferably, the angle "a" should be about 20 degrees.

Referring to FIGS. 4 and 5, a generally cylindrical recess 126 may be centrally formed in the fan chamber bottom surface 124 as shown. Recess 126 may be formed at a radius of approximately 18.6 mm about the axis B—B and may extend for a depth "b" of about 8.0 mm below the fan chamber lower surface 124. Recess 126 may include an annular lower surface 128 and a generally cylindrical sidewall surface 130 extending between the fan chamber bottom surface 124 and the recess lower surface 128. Lower surface 128 may be substantially parallel to the heat sink bottom surface 110.

A further recess 132 may be centrally formed in the lower surface 128 of the recess 126 as shown. Recess 132 may be formed at a radius of about 14.8 mm about the axis B—B and may extend for a depth "c" of about 11.2 mm below the lower surface 128 of the recess 126. Recess 132 may include a generally circular lower surface 134 and a generally cylindrical sidewall surface 136 extending between the lower surface 128 of the recess 126 and the lower surface 134. The lower surface 134 of the recess 132 may be spaced a distance "d" of about 2.5 mm from the heat sink bottom surface 110 and may be substantially parallel thereto.

The recesses 126 and 132, as described above, may be provided to facilitate mounting of the fan 60 within the heat sink chamber 120. Specifically, when the fan 60 is inserted into the heat sink 100, as shown in FIG. 3, the base member of the fan 60 may be retained within the recesses 126. The fan may, for example be secured to the lower surface 128 of the recess 126 with a conventional adhesive. Such an adhesive may be applied to either the base member of the fan 60 or to the lower surface 128 of the heat sink recess 126 or to both. Alternatively, the fan 60 may be secured within the heat sink 100 in any conventional manner.

As can be appreciated, mounting the fan 60 in the manner described above will result in an open cylindrical space, i.e., the recess 132, being located beneath the base of the fan 60. This open space may be provided in order to insulate the motor of the fan 60 from the heat sink base 104 and, thus, reduce the amount of heat which transfers from the base 104 to the fan motor. This is advantageous since it has been found that subjecting a fan motor to excessive heat tends to degrade the operation and life of the fan motor. The open space formed by the recess 132, as described above, also reduces the amount of material used to form the heat sink 100 and, thus, the overall weight of the heat sink.

Referring again to FIGS. 4 and 5, each of the slots 200 may extend into the heat sink base portion 104 and intersect the fan chamber bottom surface 124 in an upwardly facing opening. The slots 202, 204, 206 and 208, for example, intersect the fan chamber bottom surface 124 in upwardly facing openings 203, 205, 207, 209, respectively, as illustrated in FIG. 4. Each slot may include a lower surface which transitions from the maximum height of the fan chamber bottom surface 124 to a height "e", FIG. 5, of about 2.5 mm above the heat sink bottom surface 110. With respect, for example, to the slot 208, FIG. 5, a curved portion 210 may extend downwardly from the fan chamber bottom surface 124 and may intersect with a substantially flat portion 212 which may be substantially parallel to the heat sink bottom surface 110. Curved portion 210 may, for example, be formed at a radius of between about 37.5 mm and about 76.0 mm. Preferably, the radius may be about 50.4 mm. It is noted that the heat sink wall portion 114 is thinner (i.e., has a smaller radial extent) in the recessed areas 152, 172, 192 than it is in the lobes 150, 170, 190. Accordingly, the length (i.e., the radial extent) of the slot flat portion, e.g. the flat portion 212 of the slot 208, may be less in the recessed areas than in the lobes.

Referring now to FIG. 6, it can be seen that each of the slots 200 may have a rounded bottom profile as illustrated, for example, with respect to the rounded bottom profile 216 of the slot 214. This rounded profile improves the manufacturability of the heat sink 100, for example, when the heat sink is formed in a casting process. The rounded profile further enhances the heat transfer efficiency of heat with respect to the vanes 220.

Referring again to FIG. 6, each of the slots may also increase in width toward its upper end. Referring again to FIG. 6, it can be seen that the slot 214, for example, includes a draft angle "f" of about 1.5 degrees. This draft angle facilitates the manufacturability of the heat sink 100. Specifically, when manufacturing the heat sink 100, e.g., via a casting or forging operation, the draft angle "f" facilitates removal of the heat sink from the mold or casting. The draft angle "f" also increases the efficiency of the cooling vanes 220 with respect to the transfer of heat from the vanes 220 into the surrounding ambient air. The draft angle "f" further improves the aerodynamics of the heat sink with respect to air flowing through the slots 200.

Referring again to FIG. 4, heat sink 100 may include mounting feet 240, 250, 260 and 270. The mounting feet 240 and 250 may extend outwardly from the lobes 170, 190, respectively. The mounting feet 260, 270 may extend outwardly from the lobe 150. The mounting feet 240, 250, 260, 270 may include holes 242, 252, 262, 272, respectively, extending therethrough. Each hole may have a diameter of about 3.7 mm. With reference to FIG. 3, in order to attach the cooling device 50 to the electronic device package 10, screws 248, 258, 268, 278 may be passed through the heat sink holes 242, 252, 262, 272, respectively and engaged within the threaded openings 28, 30, 32, 32, respectively, in the electronic package cover portion 24, FIG. 1. As illustrated, e.g., in FIG. 3, the mounting feet 240, 250, 260, 270 may have relatively flat upper surfaces, such as the flat upper surface 264 of the foot 260, FIG. 3. Alternatively, the upper surfaces of the mounting feet 240, 250, 260, 270 may have a domed profile in order to facilitate the manufacturability of the heat sink 100, e.g., via a casting or forging process. Such a domed profile also adds rigidity to the mounting feet 240, 250, 260, 270.

Figure 8:
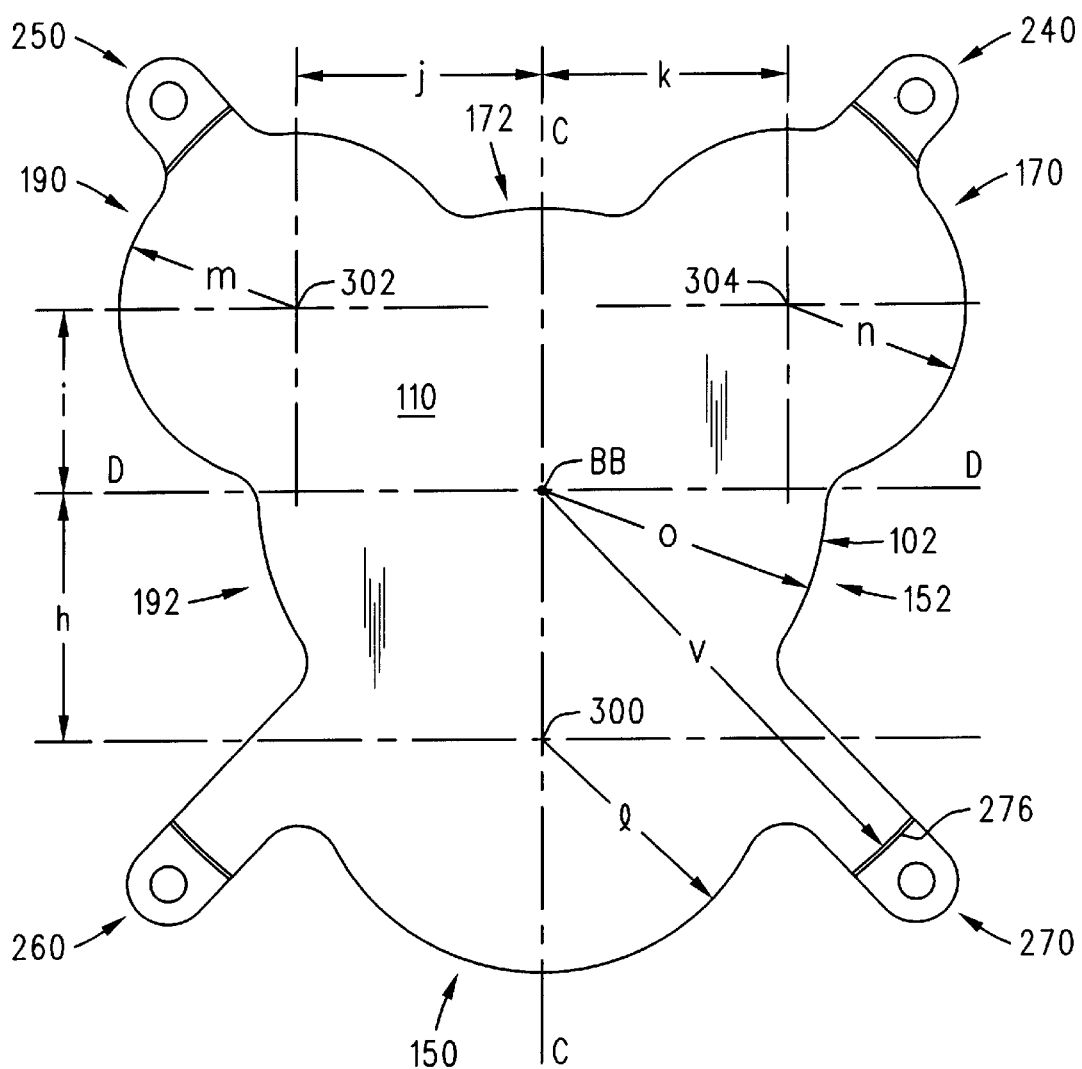
FIG. 8 is bottom plan view of the heat sink of FIG. 4.
Figure 9:
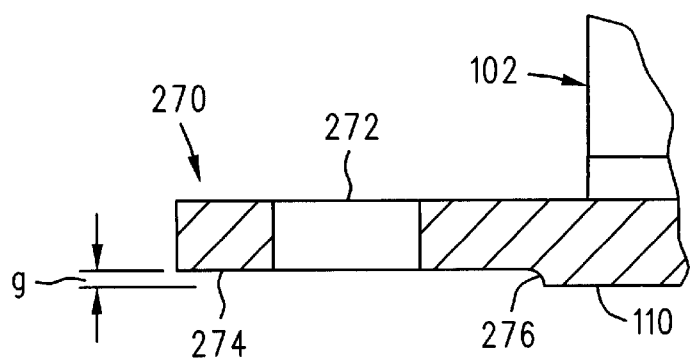
FIG. 9 is an enlarged view of a portion of FIG. 5.

FIG. 9 is an enlarged view of the foot 270 as illustrated in FIG. 5. As can be seen with reference to FIG. 9, the foot 270 may include an undercut surface 274 which may be spaced a distance "g" of about 0.5 mm from the heat sink bottom surface 110. Undercut surface 274 may be connected to the heat sink bottom surface 110 via a substantially vertical surface 276. Surface 276 may be formed at a radius "v" of about 60.0 mm from the axis B—B, as illustrated in FIG. 8. As can be appreciated, the undercut surface 276 will be spaced from the upper surface 26 of the electronic device package cover portion 24 when the cooling device 50 is mounted thereto, FIG. 3. This space allows the foot 270 to be deflected downwardly due to the tightening torque applied to the screw 278. This downward deflection, in turn, provides an upward force on the head of the screw 278 and tends to prevent loosening of the screw after it is tightened. This deflection also tends to ensure positive and reliable contact between the bottom surface 110 of the heat sink 100 and the upper surface 26 of the electronic device package 10. Each of the other feet 240, 250 and 260 may include an undercut surface identical to that described above with respect to the foot 270.

In operation, when the cooling device 50 is mounted to the electronic device package 10, as illustrated in FIG. 3, heat from heat concentration area 40, FIG. 1, will be conducted into the heat sink base portion 104 in the vicinity of the lobe 150. From there, the heat is conducted into the vanes 220 located within the lobe 150 and, to a lesser extent, into the remainder of the heat sink 100. In a similar manner, heat from heat concentration areas 42 and 44 will be conducted into the heat sink base portion 104 in the vicinity of the lobes 170, 190, respectively. From there, the heat is conducted into the vanes 220 located within the lobes 170, 190, respectively and, to a lesser extent, into the remainder of the heat sink 100.

In this manner, heat is conducted away from the heat concentration areas 40, 42 and 44. It is noted that it is advantageous to provide a heat sink having multiple lobes, as described above, as opposed to providing separate cooling devices for each heat concentration area to be cooled. This is because, in the heat sink having multiple lobes, each lobe tends to assist the other lobes in removing heat from the heat source. The lobe 170, for example, primarily serves to cool the heat concentration area 42. Because the lobe 170 is thermally connected to the lobes 150 and 190, however (via the recessed portions 152 and 172, respectively), the lobe 170 also tends to draw heat away from the heat concentration areas 40 and 44 and, thus, assist the lobes 150 and 190 in cooling the heat concentration areas 40 and 44, respectively.

To facilitate heat transfer between the upper surface 26 of the electronic package cover portion 24 and the cooling device 50, a heat conductive substance, such as a heat conductive grease, may be applied between the upper surface 26 of the electronic package cover portion 24 and the bottom surface 110 of the cooling device 50.

For efficient cooling, the heat, after being transferred into the heat sink base portion 104 and vanes 220 must be further transferred into the surrounding air. The ability of a heat sink device, such as the heat sink 100, to transfer heat into the air depends, among other things, upon the amount of surface area of the heat sink device exposed to the surrounding air. The cooling vanes 220 facilitate such heat transfer by effectively increasing the surface area of the heat sink device 100.

In operation, fan 60 may rotate in a counter-clockwise direction, as viewed, for example, in FIG. 3. Referring to FIG. 7, this counter-clockwise fan rotation will cause air movement in the general direction of the arrows 138, 139. Specifically, intake air from the exterior of cooling device 50 will enter the heat sink fan chamber 120 through the open upper end 118 of the fan chamber 120. This air movement is indicated by the arrows 140, 142 in FIG. 7. After entering the fan chamber 120, the air moves downwardly, in a direction aligned with the arrows 138, 139 through the fan chamber 120 toward the fan chamber bottom surface 124, FIG. 5. Continuing its downward movement, the air enters the lower portion of the slots 200 through upwardly facing openings of the slots, such as the upwardly facing opening 209, FIG. 5, in the fan chamber bottom surface 124. The air then travels down the lower portion of the slots 200, e.g, along the curved portion 210 and the flat portion 212 of the slot 208, FIG. 5 and exhausts from the cooling device in a substantially horizontal flow path as indicated by the arrows 144 and 146, FIG. 7.

As the air moves through the lower portion of the slots 200, as described above, it also moves between the lower portions of the associated vanes 220, located in the base portion 104, thereby cooling the vanes and removing heat from the heat sink 100.

Referring again to FIG. 7, additional intake airflow paths are indicated by the arrows 148 and 150. The airflow 148, 150 comprises air moving from the exterior of the cooling device 10, through the upper portion of the slots 200 and into the fan chamber 120. The airflow 148, 150 then joins the airflow 140, 142 to form the airflow 138, 139 previously described.

As the airflow 148, 150 moves through the upper portion of the slots 200, as described above, it also moves between the upper portions of the associated vanes 220, thereby providing additional cooling of the vanes 71, and removal of heat from the heat sink assembly 50.

As can be appreciated from the above description, each vane 220 of the heat sink 100 is cooled by two separate airflows. First, airflow 148, 150 moves past an upper portion of the vanes 220 to cool the vanes. Thereafter, the airflow 144, 146 moves past a lower portion of the vanes 220 to further cool the vanes. Accordingly, a portion of the air moving through the cooling device 50 is used twice for cooling; once on intake making up the airflow 148, 150 and a second time on exhaust partially making up the airflow 144, 146.

As previously described, the slots 220 in the heat sink assembly base portion 104 define upwardly facing openings, e.g., the upwardly facing opening 209 of the slot 208, FIG. 5. These openings serve to provide an exhaust path for air exiting the fan chamber 120 during operation of the cooling device 50. The bottom portions of the slots 200 include curved surfaces portions, such as the curved portion 210 shown in FIG. 5. These curved portions cause the airflow through the cooling device 50 to smoothly transition from the vertical airflow path 138, 139 to the horizontal exhaust flow path 144, 146 as described previously with reference to FIG. 8.

Referring now to FIG. 8, the specific shape and dimensions of the heat sink periphery 102 will now be described by way of example. A first axis C—C may be located as shown. First axis C—C intersects the axis B—B and is arranged at a right angle thereto. First axis C—C may further be chosen such that the heat sink periphery 102 is symmetrically arranged relative thereto. A second axis D—D may be formed at right angles to the axis B—B and to the axis D—D. A point 300 may lie on the axis C—C a distance "h" of about 30.3 mm from the axis D—D as shown. A point 302 may be located a distance "i" of about 22.4 mm from the axis D—D and a distance "j" of about 29.8 mm from the axis C—C, as shown. A point 304 may be located the distance "i" from the axis D—D and a distance "k" of about 29.8 mm from the axis C—C.

In the area of the lobe 150, the outer periphery 102 of the heat sink 100 may be formed having a radius "l" of about 28.4 mm from the point 300, as shown in FIG. 8. In the area of the lobe 190, the outer periphery 102 may be formed having a radius "m" of about 21.5 mm from the point 302. In the area of the lobe 170, the outer periphery 102 may be formed having a radius "n" of about 21.5 mm from the point 304. In the recessed areas 152, 172, 192, the outer periphery 102 may be formed having a radius "o" of about 34.5 mm about the axis B—B.

As can be appreciated, the heat sink wall portion 114 extends between the fan chamber outer surface 122 and the heat sink outer periphery 102. Accordingly, the wall portion 114 will be substantially thicker in the area of the lobes 150, 170, 190 than in the area of the recesses 152, 172, 192. As previously set forth, fan chamber outer surface 122 may be formed at a radius of about 29.0 mm from the heat sink central axis B—B. Given this radius, and the dimensions set forth above, the wall portion 114 may have a maximum thickness of about 29.7 mm in the area of the lobes 150, 170 and 190. In the recessed areas 152, 172, 192, the wall portion 114 may have a substantially uniform thickness of about 5.5 mm.

Referring again to FIG. 4, heat sink 100 may have a width "p" of about 90.7 mm extending between the centers of the holes 242, 252 and a length "q" of about 95.5 mm extending between the centers of the holes 242, 272, as shown. Referring to FIG. 5, heat sink 100 may extend for a distance "r" of about 141.7 mm between the outer edges of the feet 250 and 270. With further reference to FIG. 5, heat sink 100 may extend for a distance "s" of about 120 mm between the surface 276 of the foot 270 and the corresponding surface of the foot 250, as shown. Referring to FIG. 6, the outer periphery 102 of the heat sink 100 may have a width "t" of about 102.7 mm extending between the lobes 170 and 190, as shown. Referring to FIG. 7, heat sink 100 may have a length "u" of about 111.5 mm extending between the outer extent of the foot 250 and the heat sink outer periphery 102 in the area of the lobe 150.

As mentioned previously, the heat sink 100 may be symmetrical about the axis C—C, FIG. 8. Accordingly, the amount of heat sink mass located on one side of the axis C—C may be substantially equal to the amount of heat sink mass located on the opposite side of the axis C—C. Although the heat sink 100 is not symmetrically shaped about the axis D—D, the dimensions outlined above result in the amount of mass located on one side of the axis D—D being substantially equal to the amount of mass located on the opposite side of the axis D—D. This mass balance, relative to the axis D—D, results because the mass of the lobe 150 is substantially equal to the combined mass of the lobes 170 and 190. The mass of the lobe 150 may, thus, be substantially larger than the mass of each of the lobes 170, 190. The lobe 150 may be provided having a larger mass because the lobe 150 overlies the heat concentration area 40 of the electronic device package 10, FIG. 1, which, as described previously, is significantly hotter than either of the heat concentration areas 42, 44.

As can be appreciated from the above, the center of mass of the heat sink 100 will lie on the axis B—B, i.e., at the intersection of the axes C—C and D—D. This is an important feature of the heat sink 100 in that the center of mass of the heat sink is centrally located relative to the fan chamber 120 and relative to the rotational axis A—A of the fan 60.

As can be appreciated, the shape of the heat sink 100, specifically the size and shape of the lobes 150, 170, 190, allows heat sink mass to be concentrated in areas where cooling is required on the electronic device package 10, e.g., the heat concentration areas 40, 42, 44, FIG. 1. This allows the heat sink 100 to be less massive, e.g., by omitting material in the recessed areas 152, 172, 192, while still adequately cooling an electronic device package.

It is noted that the specific electronic device package 10 and the corresponding specific shape and size of the heat sink 100, including the shape, size and location of the lobes 150, 170, 190 have been disclosed herein for exemplary purposes only. The heat sink 100 may readily be configured to correspond to the configuration of any electronic device package. The heat sink 100, for example, may readily be reconfigured having a different number of lobes and/or having differently shaped, sized or located lobes in order to correspond to an electronic device package having a configuration of heat concentration areas which is different from the exemplary configuration disclosed with reference to the electronic device package 10.

It is noted that the lobes 150, 170, 190 have been described herein as being substantially circular. Although this circular shape is highly desirable, e.g., from a manufacturability standpoint, the lobes could readily be formed having other than substantially circular shapes while still providing the advantages disclosed herein. The lobes may, for example, readily be formed having a rectangular or triangular shape.

Heat sink 100 may be constructed of any heat conductive material and may, for example, be formed in a conventional casting or forging process. Alternatively, heat sink 100 may be formed in a conventional machining process. Preferably, heat sink 100 may be formed from a relatively high thermal conductivity material, such as aluminum. An AB60 aluminum, for example, may be used when the heat sink 100 is formed in a casting operation. A 6061 or 6063 aluminum may, for example, be used when the heat sink 100 is formed in a machining operation.

Figure 10:
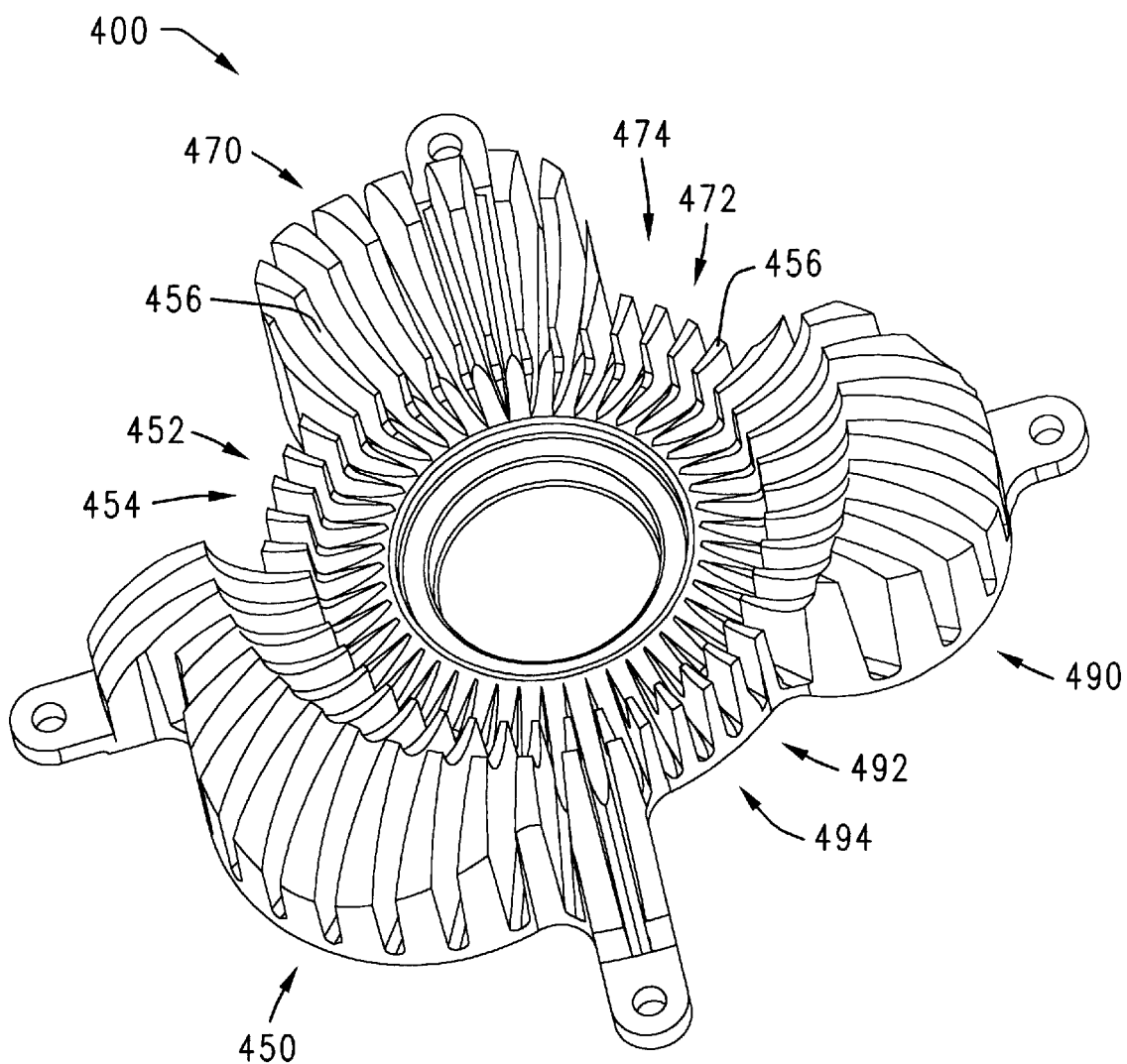
FIG. 10 is a top perspective view of another embodiment of the heat sink of FIG. 4.

FIGS. 10–15 illustrate an alternate embodiment of the cooling device 50 previously described. Referring to FIG. 10, a heat sink 400 may be provided as shown. Heat sink 400 may include a plurality of outwardly extending lobes 450, 470, 490. A recessed area 452 may be located between the lobes 450 and 470; a recessed area 472 may be located between the lobes 470 and 490 and a recessed area 492 may be located between the lobes 490 and 450. The outer periphery 402, e.g., FIG. 15, of the heat sink 400 may be substantially identical to the outer periphery 102 of the heat sink 100 previously described.

Figure 11:
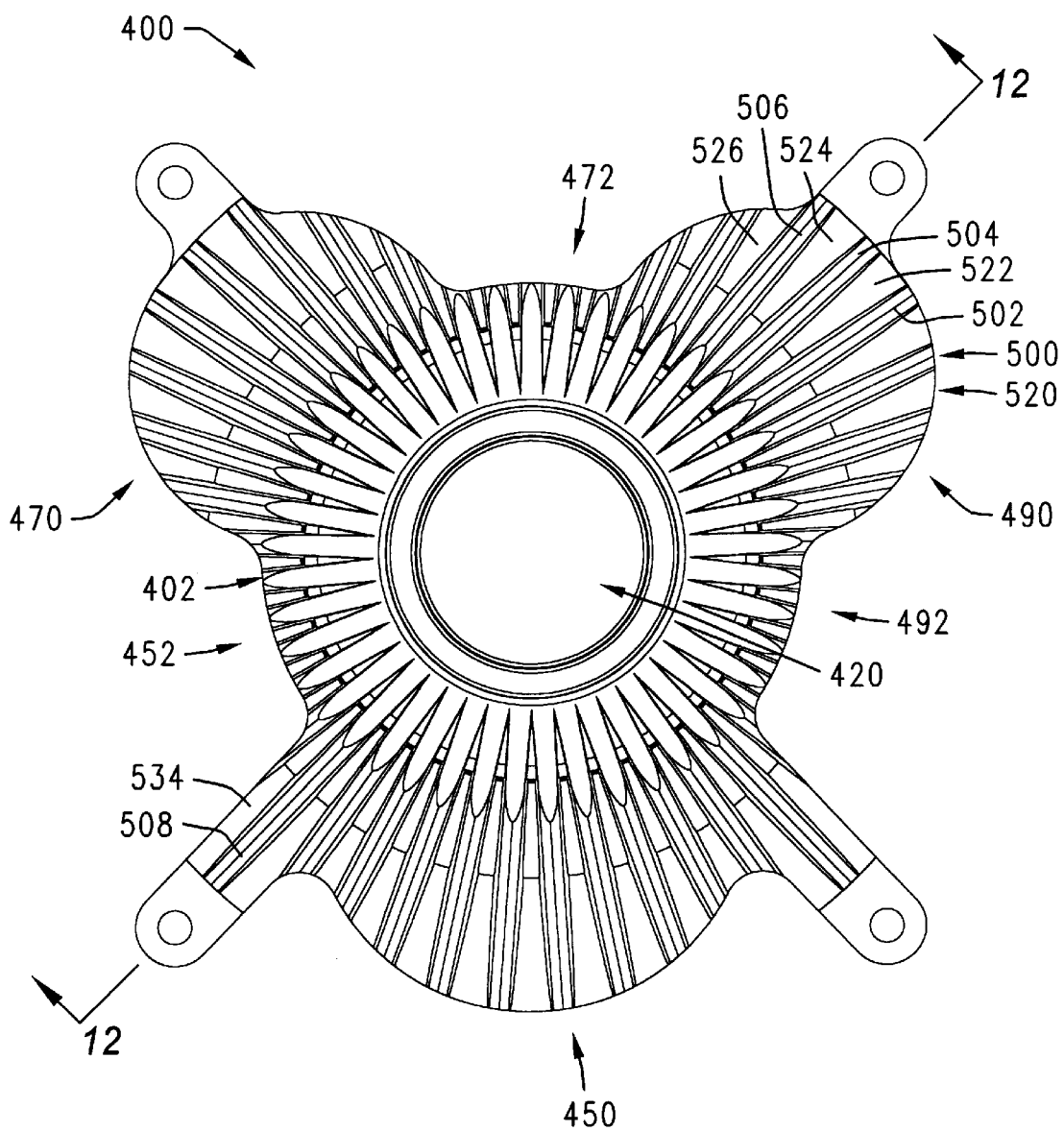
FIG. 11 is a top plan view of the heat sink of FIG. 10.
Figure 12:
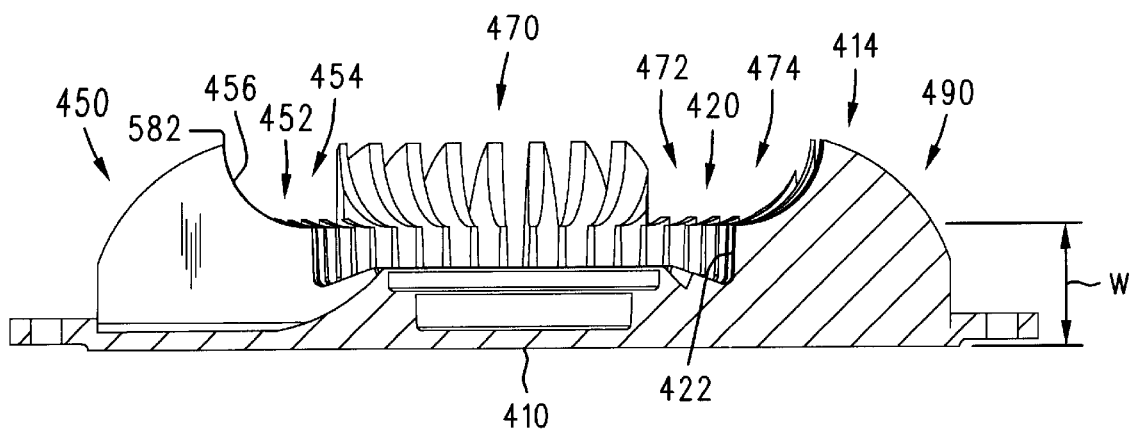
FIG. 12 is a cross-sectional elevation view taken along the line 12—12 in FIG. 11.
Figure 13:
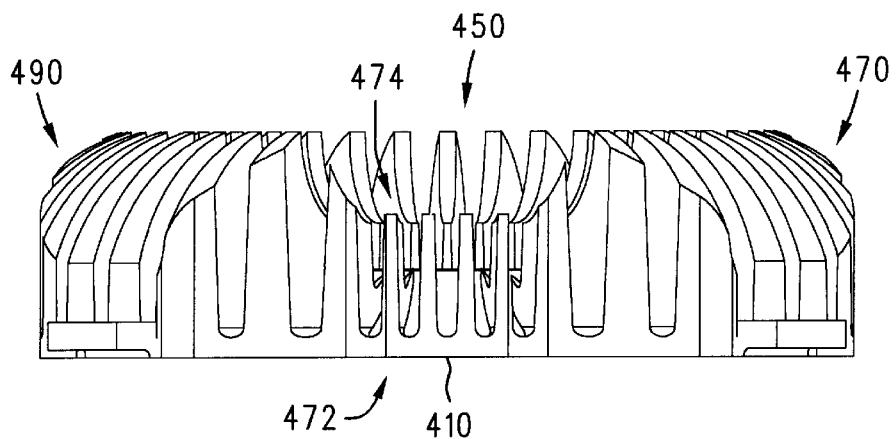
FIG. 13 is a side elevation view as viewed from the top of FIG. 11.
Figure 14:
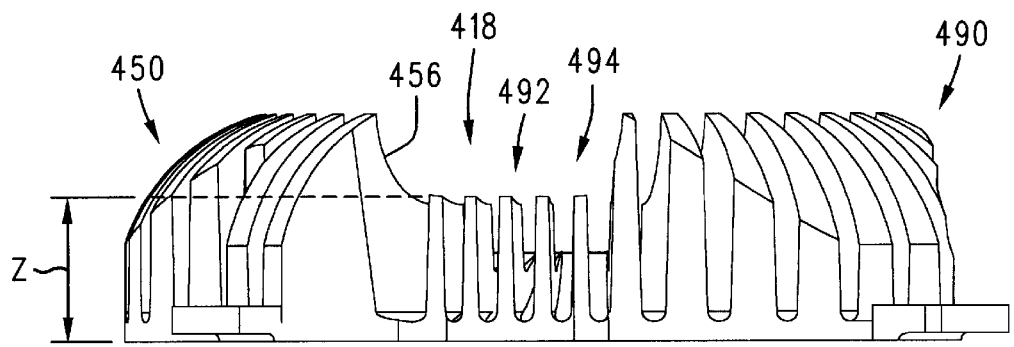
FIG. 14 is side elevation view as viewed from the right side of FIG. 11.
Figure 15:
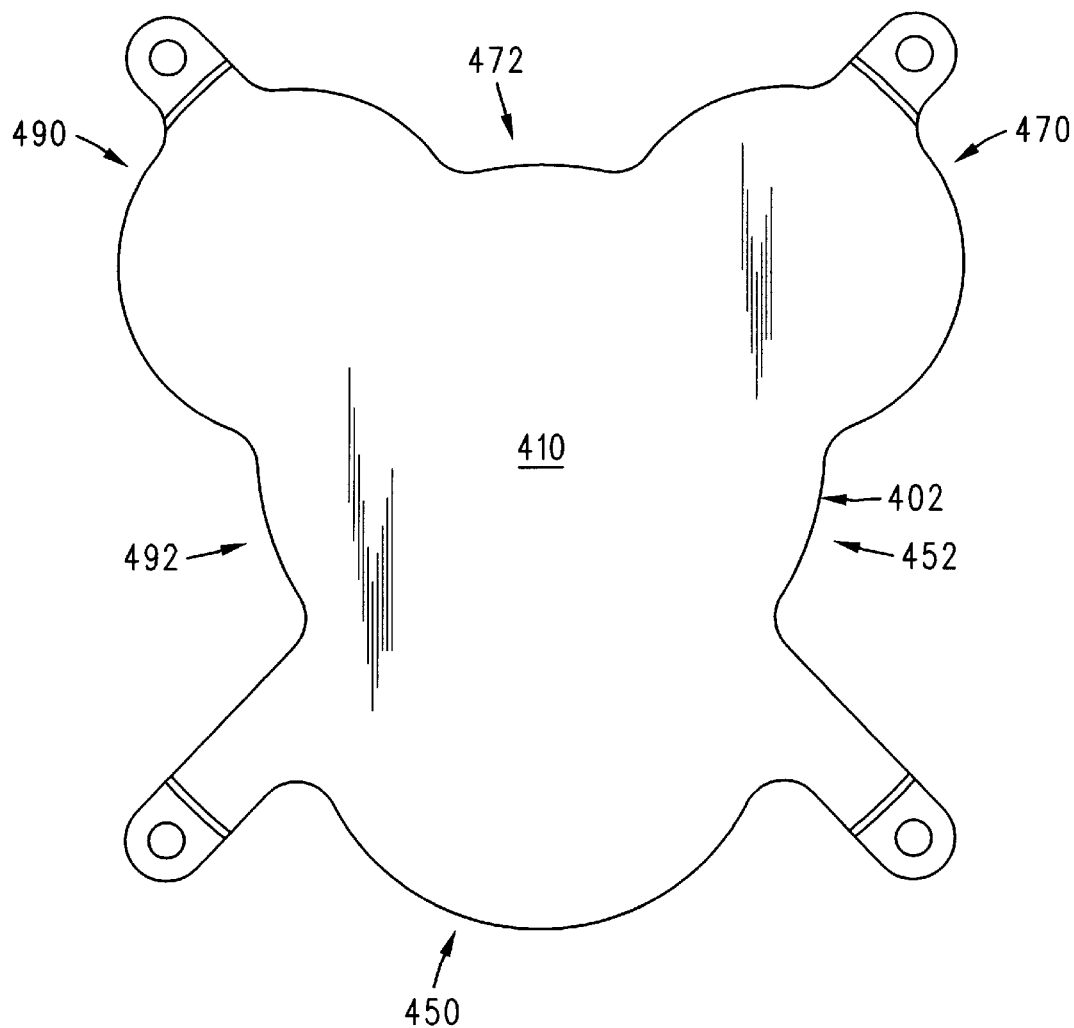
FIG. 15 is bottom plan view of the heat sink of FIG. 11.

Referring to FIGS. 11 and 12, a fan chamber 420 may be provided as shown. A plurality of slots 500, such as the individual slots 502, 504, 506, 508, may extend radially outwardly from the fan chamber 420 to the outer periphery 402 of the heat sink 400. A plurality of cooling vanes 520, such as the individual cooling vanes 522, 524, 526, 534 may also extend radially outwardly from the fan chamber 420 to the outer periphery 402. As can be appreciated, one of the cooling vanes 420 will extend between every two of the slots 400 as illustrated, for example, with reference to the cooling vane 422 extending between the slots 402 and 404 and the cooling vane 424 extending between the slots 404 and 406.

Heat sink 400 may be substantially identical to the heat sink 100 previously described, except that the fan chamber 420 of the heat sink 400 may include a widened portion as will now be described in detail. Referring to FIG. 12, the i-an chamber 420 may include an outer surface 422 which, at its lower extent, may be substantially identical to the outer surface 122 of the fan chamber 120 of the heat sink 100 as previously described. At its upper extent, however, the outer surface 422 may flare outwardly as shown. Specifically, this outward flaring may be accomplished by providing a curved surface 456 on each of the vanes 520. Curved surface 456 may have a radius of about 12 , mm and may begin a distance "w" of about 14.5 mm above the bottom surface 410 of the heat sink 400.

The widened portion of the fan chamber 420, as described above, results in a plurality of openings being formed in the wall portion 414, FIG. 12, of the heat sink 400. Specifically, the openings 454, 474, 494 may be formed in the recessed areas 452, 472, 492, respectively, due to the reduced thickness of the wall portion 414 in those areas. As can be appreciated, with reference to FIG. 14, the carved surface 456 will cause the wall portion 414 to have a lower height "z" in the area of the recesses 454 474, 494. This relatively lower height "z" results in the openings 454, 474, 494. The height "z" may, for example, be about 15.5 mm.

It has been found that the provision of the openings 454, 474, 494, as described above, allows the heat sink 400 to operate in low clearance environments, e.g., an environment in which an adjacent electronic component is in close proximity to the upper edge 582, FIG. 12, of the heat sink 400. In such a low clearance environment, air may be substantially prevented from entering the fan chamber 420 via the open upper end 418 of the heat sink 400. The provision of the openings 454, 474, 494, however, provides an alternate route for air to enter the fan chamber 420 and, thus, allows air to circulate through the heat sink 400. The heat sink 400 may, thus, operate efficiently even in a low clearance environment. It has been found, in fact, that the heat sink 400, having the openings 454, 474, 494, will function even in an environment where there is no clearance above the heat sink upper edge 582.

It is noted that, although a curved surface 456 is described above, a widened fan chamber may alternatively be provided by merely angling the outer surface 122 of the fan chamber 120. Specifically, the outer surface 122 may angle outwardly and upwardly such that the fan chamber 120 is wider at its upper extent (i.e., near the open upper end 118 of the heat sink) than at its lower extent (i.e., near the bottom surface 124 of the fan chamber). The outer surface 122 may, for example, be angled at an angle of about 20 degrees with respect to the vertical (i.e., with respect to the axis B—B.)

The widened portion of the fan chamber 420 also serves to space at least portions of the outer surface 422 of the fan chamber 420 from the edges of the fan blades when a fan, such as the fan 60 previously described, is inserted within the fan chamber 420. This spacing has been found to reduce the noise generated by the fan when in operation, without significantly reducing the heat removal ability of the heat sink 400. The widened portion also results in less heat sink material, relative to the heat sink 100, and thus results in a less expensive and lighter weight heat sink relative to the heat sink 100.

Other than the provision of the widened fan chamber 420, as described above, the heat sink 400 may be formed and may function in an identical manner to the heat sink 100 previously described.

Figure 16:
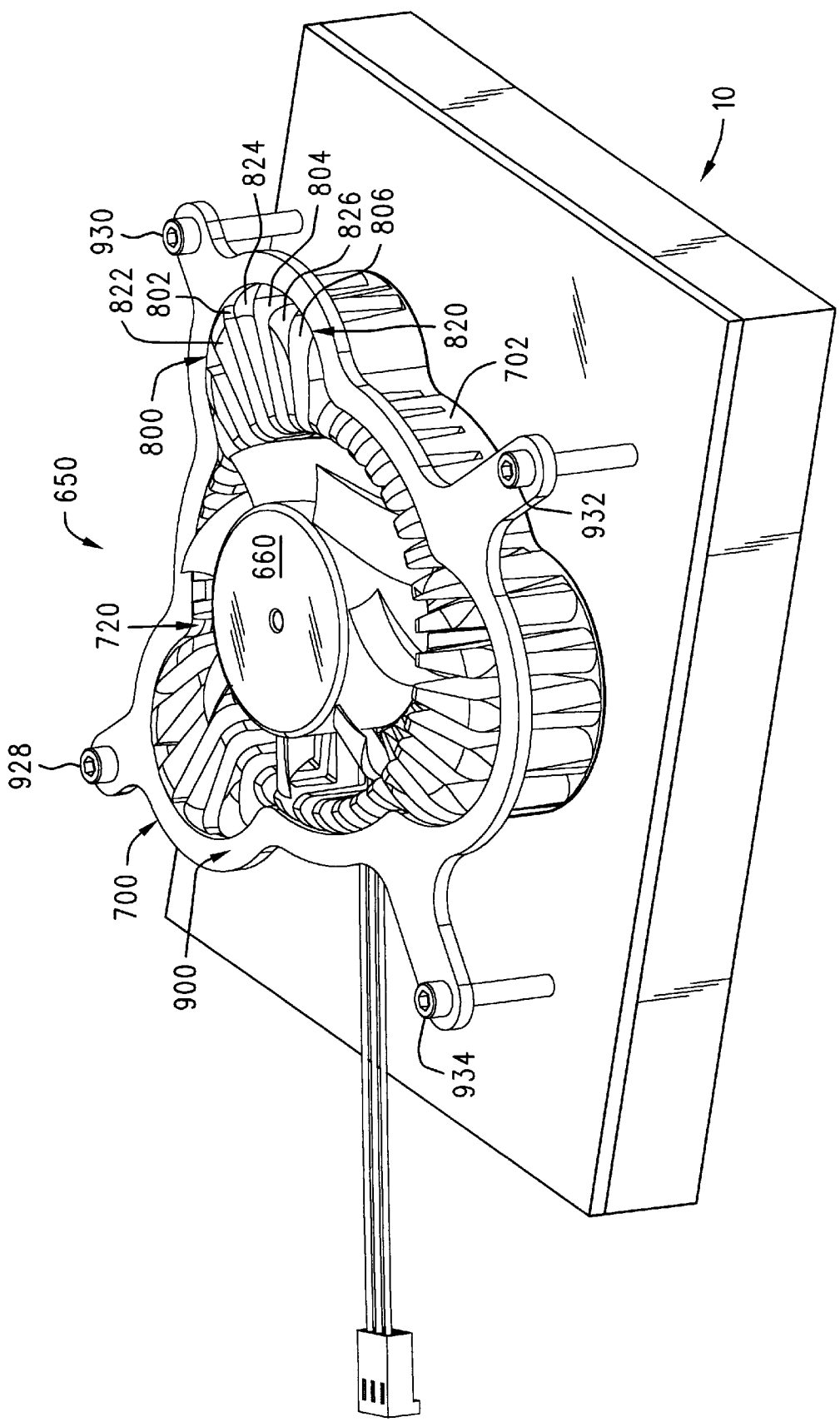
FIG. 16 is a top perspective view of another embodiment of the cooling device of FIG. 3, mounted on the electronic package of FIG. 1.
Figure 17:
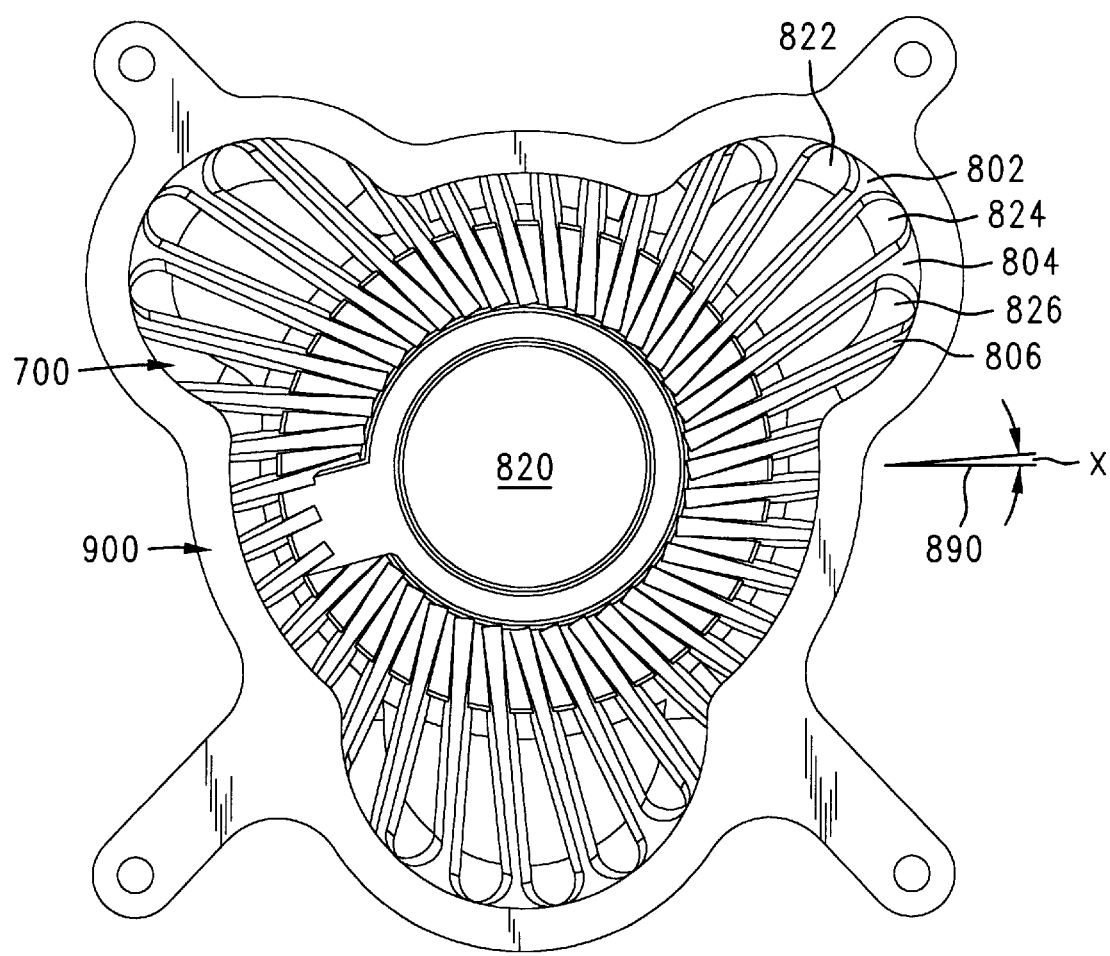
FIG. 17 is a top plan view of a heat sink of the cooling device of FIG. 16.

FIGS. 16 and 17 illustrate a further embodiment of the cooling device 50. Referring to FIG. 16, a cooling device 650 may be provided mounted to the electronic device package 10. Cooling device 650 may include a fan 660 housed within the fan chamber 720 of heat sink 700 in a manner similar to the fan 60 and the heat sink 100, previously described. Heat sink 700 may include a plurality of outwardly extending lobes and alternating recesses in a manner substantially identical to the heat sink 100. A plurality of slots 800, such as the individual slots 802, 804, 806 may extend outwardly from the fan chamber 720 to the outer periphery 702 of the heat sink 700. A plurality of cooling vanes 820, such as the individual cooling vanes 822, 824, 826 may also extend outwardly from the fan chamber 720 to the outer periphery 702. As can be appreciated, one of the cooling vanes 820 will extend between every two of the slots 800 as illustrated, for example, with reference to the cooling vane 824 extending between the slots 802 and 804.

Heat sink 700 may be substantially identical to the heat sink 100. In the heat sink 700, however, the slots 800 and vanes 820 are not radial, but, instead, are offset from the radial direction. Referring to FIG. 17, it can be seen that the slots 800 and vanes 820 may be offset an angle "x" of about 8.0 degrees from the radial direction 890. This non-radial configuration of the slots and vanes may be provided in order to reduce the noise generated by the fan 660 when in operation.

Heat sink 700 may also differ from the heat sink 100 in that the heat sink 700 may be mounted to the electronic component 10 with a mounting bracket 900. Mounting bracket 900 may be configured to have substantially the same shape as the periphery 702 of the heat sink 700. Referring to FIG. 16, the bracket 900 may fit over the upper portion of the heat sink 700 and may be secured to the electronic package 10 via threaded bolts 928, 930, 932, 934, as shown, engaged within the electronic package threaded openings 28, 30, 32, 34, respectively, FIG. 1.

Bracket 900 may be formed as a separate part from the heat sink 700. In this case, the heat sink 700 may be provided with a shoulder portion, not shown, to allow the bracket 900 to apply downward force to the heat sink 700 relative to the electronic package 10. Alternatively, the bracket 900 may be integrally formed with the heat sink 700 in, e.g., a casting process. In the case where the bracket 900 is integrally formed with the heat sink 700, a fillet, or a plurality of fillets, not shown, may be provided at the lower juncture of the bracket 900 and the heat sink 700 in order to add strength and stability. The bracket 900 may also act as an air separator, thus preventing the recirculation of warm air about the exterior of the heat sink. The bracket 900 may, for example, serve to physically separate the upper, intake air flow paths 140, 142, FIG. 7, from the lower intake and exhaust airflow paths 144, 146, 148, 150.

Other than for the provision of the non-radial slots and vanes and the bracket mounting arrangement, as described above, the heat sink 700 may be formed and may function in an identical manner to the heat sink 100 previously described.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling device for dissipating heat, said cooling device comprising:
   a substantially planar surface;
   a chamber having a first open end and a second substantially closed end;
   a heat conductive portion extending between said chamber second closed end and said planar surface;
   a chamber wall member substantially surrounding said chamber, wherein said chamber wall member includes:
      a first protrusion comprising an enlarged portion of said chamber wall member;
      a second protrusion comprising an enlarged portion of said chamber wall member;

a recessed area located between said first protrusion and said second protrusion, said recessed area comprising a smaller portion of said chamber wall member relative to said first protrusion and said second protrusion; and wherein said first protrusion is larger than said second protrusion.

2. The cooling device of claim 1 and further including a plurality of slots extending through said chamber wall member.

3. The cooling device of claim 2 wherein said plurality of slots communicate with said chamber.

4. The cooling device of claim 2 wherein said plurality of slots are arranged in a generally radial configuration.

5. The cooling device of claim 1 wherein said chamber wall member further includes:

a third protrusion comprising an enlarged portion of said chamber wall member.

6. The cooling device of claim 5 wherein said third protrusion is smaller than said first protrusion.

7. The cooling device of claim 5 wherein said chamber wall member further includes:

a second recessed area located between said first protrusion and said third protrusion, said second recessed area comprising a smaller portion of said chamber wall member relative to said first, second and third protrusions.

8. The cooling device of claim 1 and further including a fan located in said chamber.

9. The cooling device of claim 1 wherein said chamber is substantially cylindrically formed about a cooling device central axis.

10. The cooling device of claim 9 wherein said chamber second substantially closed end slopes toward said substantially planar surface in a radial outward direction relative to said cooling device central axis.

11. The cooling device of claim 9 wherein said cooling device has a center of mass and wherein said center of mass is located along said cooling device central axis.

12. The cooling device of claim 1 and further comprising:

a cooling device central axis extending normal to said substantially planar surface;

wherein said chamber has a first width, measured normal to said central axis, at a first distance from said substantially planar surface;

wherein said chamber has a second width, measured normal to said central axis, at a distance from said substantially planar surface that is greater than said first distance; and wherein said second width is greater than said first width.

13. The cooling device of claim 1 wherein said first protrusion has a generally rounded profile.

14. A cooling device for cooling a component having a first heat generating area and a second heat generating area spaced a first distance from said first heat generating area, said cooling device comprising:

a plurality of vanes having slots extending therebetween;

said plurality of vanes defining an external periphery of said cooling device;

said external periphery including a first outwardly extending protrusion and a second outwardly extending protrusion;

wherein said second outwardly extending protrusion is spaced said first distance from said first outwardly extending protrusion;

a chamber substantially cylindrically formed about a central axis of said cooling device; and a fan located in said chamber.

15. The apparatus of claim 14 wherein said component includes a third heat generating area spaced a third distance from said first heat generating area and wherein said cooling device further comprises:

said external periphery including a third outwardly extending protrusion;

wherein said third outwardly extending protrusion is spaced said third distance from said first outwardly extending protrusion.

16. The cooling device of claim 13 wherein said first outwardly extending protrusion has a generally rounded profile.

17. The cooling device of claim 14 wherein said slots communicate with said chamber.

18. The cooling device of claim 13 wherein said slots are arranged in a generally radial configuration.

19. The cooling device of claim 13 wherein said second outwardly extending protrusion is smaller than said first outwardly extending protrusion.

20. The cooling device of claim 14 wherein said third outwardly extending protrusion is smaller than said first outwardly extending protrusion.

21. The cooling device of claim 13 wherein said cooling device includes a substantially planar surface and wherein said chamber includes a first open end a second substantially closed end.

22. The cooling device of claim 21 wherein said chamber second substantially closed end slopes toward said planar surface in a radially outward direction relative to said cooling device central axis.

23. The cooling device of claim 13 wherein said cooling device has a center of mass and wherein said center of mass is located along said cooling device central axis.

24. A cooling assembly comprising:

a heat source including:

a first heat emitting area;

a second heat emitting area distinctly located with respect to said first heat emitting area;

a cooling device including:

a plurality of vanes having slots extending therebetween;

said plurality of vanes defining an external periphery of said cooling device;

said external periphery including a first outwardly extending protrusion and a second outwardly extending protrusion;

wherein said first outwardly extending protrusion is located adjacent said first heat emitting area;

said heat source further includes a third heat emitting area distinctly located with respect to said first heat emitting area and said second heat emitting area;

said cooling device external periphery further includes a third outwardly extending protrusion; and wherein said third outwardly extending protrusion is located adjacent said third heat emitting area.

25. The cooling assembly of claim 24 wherein said second outwardly extending protrusion is located adjacent said second heat emitting area.

26. The cooling assembly of claim 24 wherein said cooling device is attached to said heat source.

27. The cooling assembly of claim 24 wherein said first outwardly extending protrusion has a generally rounded profile.

28. The cooling assembly of claim 24 wherein said cooling device further includes a chamber therewithin formed substantially cylindrically about a cooling device central axis.

29. The cooling assembly of claim 28 wherein said cooling device has a center of mass and wherein said center of mass is located along said cooling device central axis.

30. The cooling assembly of claim 28 wherein said plurality of slots communicate with said chamber.

31. The cooling assembly of claim 24 wherein said slots are arranged in a generally radial configuration.

32. The cooling assembly of claim 24 wherein said first outwardly extending protrusion is larger than said second outwardly extending protrusion.

33. The cooling assembly of claim 28 and further including a fan located in said chamber.

34. The cooling assembly of claim 28 wherein:

said cooling device includes a substantially planar surface;

said fan chamber includes a first open end and a second substantially closed end; and wherein said chamber second substantially closed end slopes toward said planar surface in a radial outward direction relative to said cooling device central axis.

* * * * *